(12) United States Patent
Schindler

(10) Patent No.: US 6,232,207 B1
(45) Date of Patent: *May 15, 2001

(54) DOPING PROCESS FOR PRODUCING HOMOJUNCTIONS IN SEMICONDUCTOR SUBSTRATES

(75) Inventor: Roland Schindler, Freiburg (DE)

(73) Assignee: Fraunhofer Gesellschaft zur Förderung der angewandten Forschung e.V., Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/043,355
(22) PCT Filed: Aug. 26, 1996
(86) PCT No.: PCT/DE96/01598
§ 371 Date: May 29, 1998
§ 102(e) Date: May 29, 1998
(87) PCT Pub. No.: WO97/11481
PCT Pub. Date: Mar. 27, 1997

(30) Foreign Application Priority Data

Sep. 18, 1995 (DE) ............................... 195 34 574

(51) Int. Cl.⁷ ............................. H01L 21/22; H01L 21/38
(52) U.S. Cl. ................. 438/562; 428/563; 148/DIG. 37; 148/DIG. 38

(58) Field of Search ..................................... 438/552, 550, 438/531, 562, 563; 148/DIG. 37, DIG. 38, FOR 323, FOR 324

(56) References Cited

U.S. PATENT DOCUMENTS

| 4,273,950 |   | 6/1981  | Chitre .         |
|-----------|---|---------|------------------|
| 4,619,036 | * | 10/1986 | Havemann et al. .|
| 5,510,271 | * | 4/1996  | Rogtagi et al. . |
| 5,543,352 | * | 8/1996  | Ohtani et al. .  |

FOREIGN PATENT DOCUMENTS

| 3402653 A1 | 8/1985  | (DE) . |
| 4223403 C1 | 12/1993 | (DE) . |
| 2131608    | 6/1984  | (GB) . |

OTHER PUBLICATIONS

IEEE Trans. Electron Devices, vol., ed. 39, 1992, pp. 105–110.

* cited by examiner

Primary Examiner—Charles Bowers
Assistant Examiner—Scott J. Hawranek
(74) Attorney, Agent, or Firm—Evenson, McKeown, Edwards & Lenahan, P.L.L.C.

(57) ABSTRACT

In doping process for producing homojunctions in a semiconductor substrate, and the semiconductor substrate, dopants penetrate by way of diffusion employing an ultraviolet light source. A mask is introduced between the light source and the semiconductor which has regions of varying thickness. Dopant material is placed between the mask and the substrate, and the mask is then irradiated by the light source.

23 Claims, 3 Drawing Sheets

DOPING PROCESS FOR PRODUCING HOMOJUNCTIONS IN SEMICONDUCTOR SUBSTRATES

BACKGROUND AND SUMMARY OF THE INVENTION

This application claims the priority of German Patent Document 19534574.6, which was filed on Sep. 18, 1995, the disclosure of which is expressly incorporated by reference herein.

The present invention relates to a doping process for producing homojunctions in semiconductor substrates, into which dopants penetrate by diffusion. Furthermore, a light source is provided, the emission spectrum of which contains ultra-violet components, and which is directed at the surface of the semiconductor substrate. A process of this type is known, by way of illustration from IEEE Trans. Electron Devices, vol., ed. 39, 1992, pp. 105 to 110.

Diffusion and/or implantation techniques are employed for producing sharply defined adjacent doping regions in semiconductor substrates having different concentrations of the same dopants, i.e. p- or n-dopant atoms. In order to be able to dope solely the selected regions in the semiconductor base substrates, masks which are impenetrable for the dopant atoms in the selected diffusion and implantation conditions are provided on the substrates surface to be doped.

In the case of silicon semiconductor base substrates, silicon oxide masks, which are either thermally grown or precipitated as layers, are provided on the silicon surface. In order to produce masks of this type, a photosensitive resist is applied onto a homogeneously precipitated silicon oxide layer, with the photosensitive resist being exposed to light with the aid of suited shadow masks. On the exposed sites, a subsequent etching step removes the oxide layer locally down to the base substrate, which can then be enriched with a desired concentration of dopant atoms in the course of diffusion and/or implantation. Thus, selective doping of semiconductor base substrates using known doping techniques requires preliminary structuring measures; the mask layer which is active for diffusion has to be locally removed prior to diffusion. Another masking step, is required to remove the diffusion block locally.

In particular, the production of solar cells provided with a two-step emitter structure requires two complicated process diffusion steps which can be conducted using conventional methods of diffusion.

FIG. 3 shows the production of a two-step emitter solar cell using the known etching diffusion techniques, including the sequence of the individual steps a to h. In the course of a high temperature step, in FIG. 3a an oxide layer 32, which can be generated in a conventional process-controlled heating furnace, is applied to the base substrate 31. Using conventional spin-on techniques, a photosensitive resist 33 is applied evenly onto the oxide layer. In a subsequent photolithographic step, the photosensitive resist 33 is exposed to light with the use of suited masks in a conventional manner (See FIG. 3c.) At the sites exposed to light where the oxide layer is to be removed, the light-sensitive photoelectric layer is removed. In a subsequent etching step according to FIG. 3d, the oxide layer 32 can be removed at the sites exposed to light in a selective manner in such a way that local removal of the oxide layer down to the base substrate surface becomes possible. Then, according to process step FIG. 3e, the photosensitive resist is removed. Following this comes the first diffusion step (3f) with $n^{++}$-dopant atoms which can only penetrate into the material via the free base substrate surface (for this see the white-dotted $n^{++}$-dopant atoms region 34). In a further process step (3g), again corresponding to an etching step, the remaining oxide regions are removed from the surface of the base substrate in such a manner that a homogeneous $n^+$-doping 35 can occur in a subsequent second diffusion step, which in this case, according to the representation in FIG. 3h, is whole surface $n^+$-diffusion.

In the aforedescribed manner, so-called two-step emitter solar cells composed of two adjacent $n^+/n^{++}$ junctions can be produced.

The described production process of a two-step emitter comprises two diffusion steps. The first provides for local and deep diffusion, and the second provides for whole surface homogeneous diffusion. Both diffusion and oxidation are conducted in classical diffusion and oxidation furnaces at very high process temperatures of >1000° C.

In the development of components and the use of novel materials (and in order to improve the effectiveness and the reliability of the semiconductor components, which due to the hitherto prevailing conditions depend on the production of thermal doping processes), it is necessary to lower the thermal input during production. Thermal input refers to the duration of the thermal diffusion and oxidation steps including the absolute temperature level predominating during the diffusion and oxidation procedure. In order to meet these requirements, "rapid thermal processing" (RTP), in which the to-be-processed semiconductor substrates are individually optically heated, has been utilized.

Contrary to conventional heating methods, which are essentially based on the influence of infrared radiation on the to-be-heated substrate, the RTP method employs radiation intensive illumination units, which essentially emit in the ultraviolet spectral range. A more detailed explanation is given in R. Singh's article, Development Trends in Rapid Isothermal Processing (RIP) dominated Semiconductor Maufacturing" in, 1st Int. Rapid Thermal Processing Conf. RTP 93" Scotsdale, Ariz., Eds. Richard Fair and Bohumil Lojek, September 1993, pp. 31 to 42.

In particular in RTP methods, the diffusion properties of the dopant atoms penetrating the to-be-doped semiconductor material can be decisively influenced by the characteristic heating rates which can be obtained by means of the new "rapid thermal processing" techniques. By way of illustration, A. Usami's article, Shallow-Junction Formation on Silicon by Rapid Thermal Diffusion of Impurities from a Spin-On Source", IEEE Transactions on Electron Devices, vol. ED 39, 1992, pp. 105 ff. explains that the diffusion coefficients can be set in a specific range in a selective manner by employing new, optical heating methods.

One object of the present invention is to provide an improved doping process for producing homojunctions in semiconductor substrates into which dopants penetrate in the course of diffusion, using a light source which has an emission spectrum containing ultra-violet components and is directed at the surface of the semiconductor substrate.

Another object of the invention is to shorten the time required for production of components of this type and essentially involve considerably lower costs.

Still another object of the invention is to reduce thermal input on the semiconductor components during their production.

With the aid of new RTP methods described in the introduction, the production of semiconductor components having homojunctions and, in particular, two-step emitter solar cells can be simplified so that only a single thermal processing step is required. According to the present invention, a mask is placed between a semiconductor and a light source, dopant atoms are introduced between the mask and the semiconductor substrate to be doped, and rapid thermal processing is used, irradiating the mask with the light source.

The process uses a light source, which has an emission spectrum containing ultra-violet components and which is directed at the semiconductor substrate. Depending on the to-be-doped regions with the same dopant concentration, the mask has regions of varying thickness, and is placed between the to-be-doped semiconductor substrate and the light source. The light coming from the illumination source impinges at suited sites, where the mask has holes through it, directly upon the base substrate and immediately interacts with the surface of the substrate. At sites where the mask covers the surface of the substrate, only the parts which are of the emission spectrum of the illumination unit which are not absorbed by the mask material reach the surface of the substrate. In addition, the thermal radiation of the mask itself acts on the regions of the semiconductor substrate covered by the mask so that, in addition to the electromagnetic radiation, the black body radiation coming from the mask acts on the surface of the semiconductor substrate and influences the temperature profile on the surface of the semiconductor substrate.

In the invented combination of the method of rapid thermal processing and using suited masking, the surface of the to-be processed semiconductor substrate is impinged upon with the desired varying spectral distribution of the radiation field acting on the semiconductor surface in such a manner that different diffusion constants, which determine the diffusion process, can be set in various regions of the to-be-doped semiconductor substrate surface.

Because an intermediate layer containing the dopant atoms is placed between the mask and the to-be doped semi-conductor substrate surface, depending on the diffusion constants setting in due to the different spectral distribution of the radiation acting on the substrate surface, the speed of the diffusion process responsible for introducing the dopant atoms into the semiconductor base substrate varies at different sites.

For instance, the diffusion processes at the sites of the semiconductor base substrate irradiated without hindrance by the illumination unit are faster due to the optical excitation by short-wave light. On the other hand, at the sites provided with the masking material, the dopant atoms penetrate more slowly into the surface of the substrate.

In this manner, a suited selection of the mask permits generating dopant profiles within the semiconductor base substrate requiring only a single process step, namely the aforedescribed illumination process with an illumination time of approximately 10 seconds and a process temperature of about 900° C.

Other objects, advantages and novel features of the present invention will become apparent from the following detailed description of the invention when considered in conjunction with the accompanying drawings.

DETAILED DESCRIPTION OF PREFERRED EMBODIMENTS

The sections a to h of FIG. 3 show the production steps for two homojunctions in a semiconductor substrate, which are inserted into two-step emitter solar cells. An essential drawback of the known process is that two separate diffusion steps have to be carried out for producing the first deep $n^{++}$-diffusion region and the subsequent laterally adjacent $n^+$-diffusion regions to be maintained within the scope of a homogeneous diffusion. Both diffusion processes require process temperatures of above 1000° C. In order to prevent such high temperatures and, in particular, to carry out the second diffusion process, the to-be-doped semiconductor base substrate is processed using RTP techniques.

Figure 1A:
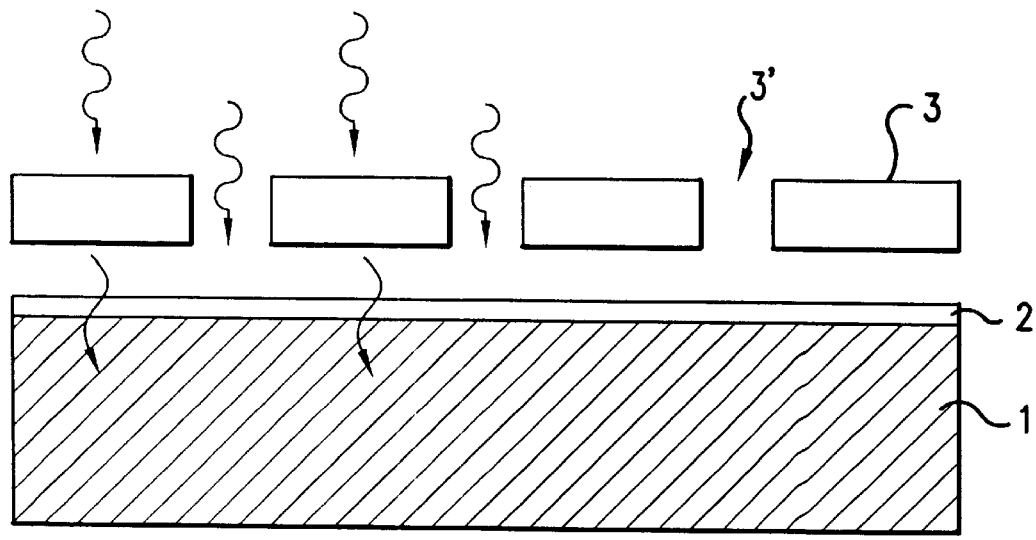
FIGS. 1a and b are alternative mask configurations according to the invention.
Figure 1B:
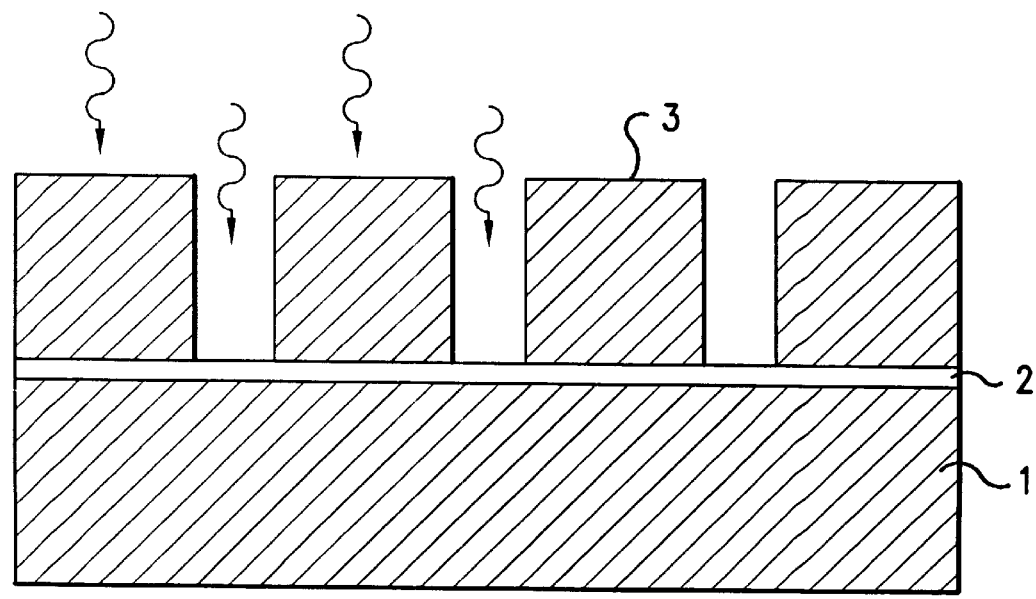

According to FIG. 1a, a filmlike coat 2 containing the dopant atoms is applied onto semiconductor base substrate 1. Preferably, the coat is applied onto the semiconductor substrate by means of a centrifugal method such as spin-on techniques. A mask 3 provided with through holes 3 is disposed directly or spaced over the filmlike coat 2. An illumination unit (not shown), the emission spectrum of which contains ultra-violet components, is provided above the mask. The beams emitted from the light source impinge upon the masking material at sites on the mask 3 and are absorbed by it in a suited manner. The radiation parts penetrating through the mask reach through the dopant layer into the semiconductor substrate 1, where they interact with the semiconductor material. At sites where the mask 3 has holes, the beams emitted from the light source reach directly through the dopant layer 2, without hindrance into the semiconductor material 1. Depending on the radiation parts, suited diffusion constants determining the diffusion process set in the semiconductor layers near the surface.

In the regions where the radiation parts can penetrate the semiconductor substrate without hindrance, the diffusion process is faster than in the regions covered by the mask 3. By virtue of the optically induced diffusion of the dopant and the locally varying diffusion process setting in on the semiconductor substrate due to the spectral distribution, the same results can be achieved using only a single process step that are obtained with the sequence of process steps shown in FIGS. 3a to 3h. The invented procedure permits considerably shortening the known doping processes for producing homojunctions and thereby reducing production costs considerably.

In order to rule out contamination problems in manufacturing semiconductor components, the same material is employed for the masking material as is used for the semiconductor. Therefore, according to FIG. 2b, the wafer sections 3 can lie directly on top of the dopant layer 2 on the semiconductor base substrate 1. This direct contact of mask 3 to the semiconductor substrate permits intensifying the diffusion yielded to the varying distribution of radiation due to the previously mentioned temperature effect. Although light absorption is greatest on the surface of the mask opposite the light source, it decreases exponentially in dependence on the wavelength with increasing penetration depth. The related generation of heat in the materials is inhomogeneous corresponding to the decrease in light absorption resulting in, as previously described, two different diffusion constants. Due to the direct contacting of the masking materials with the surface of the substrate, inhomogeneous heating of the semiconductor substrate occurs due to the altered thermal mass, resulting in the radiation action in the semiconductor material in different diffusion constants.

Figure 2:
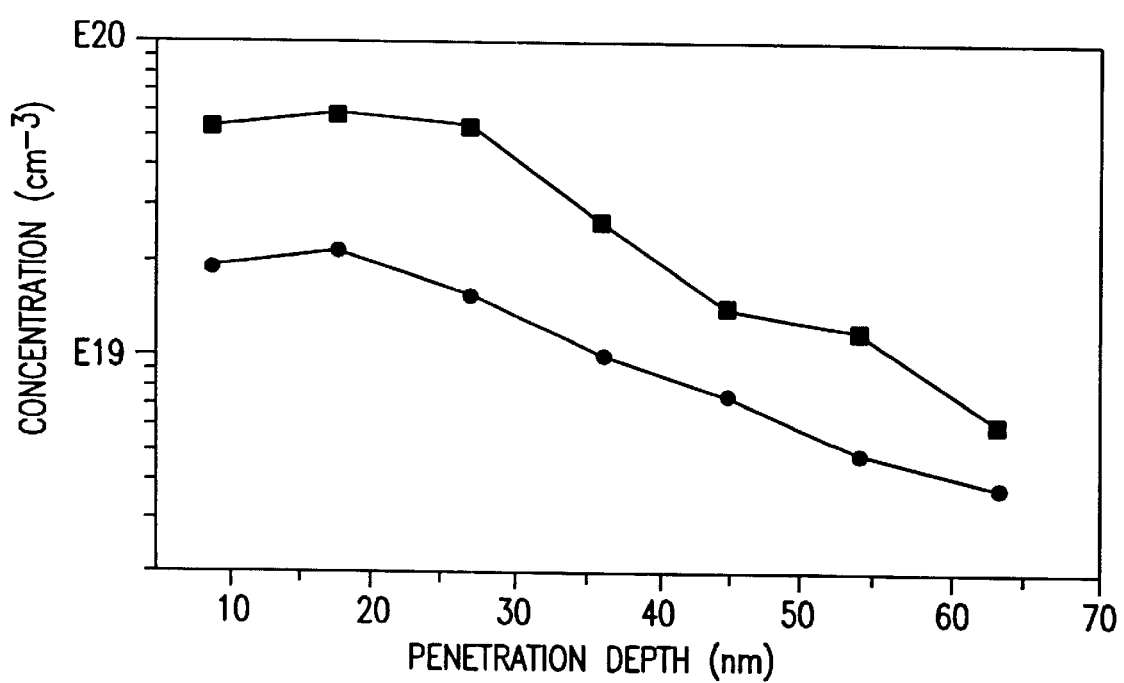
FIG. 2 is a diagram which shows the dependence of the penetration depth of the dopant atoms on the degree of masking.
Figure 3A:
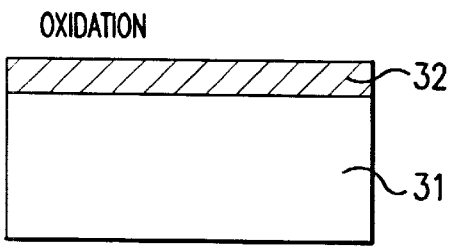
FIGS. 3a to h are process steps for producing a state-of-the-art two-step emitter solar cell.
Figure 3E:
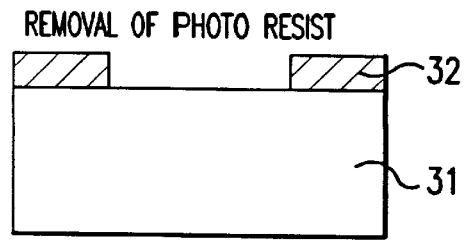
Figure 3B:
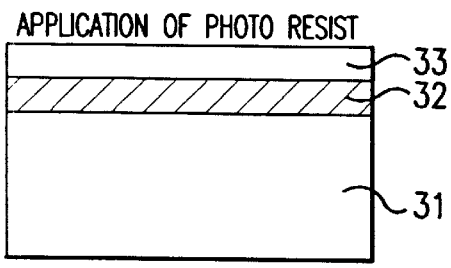
Figure 3F:
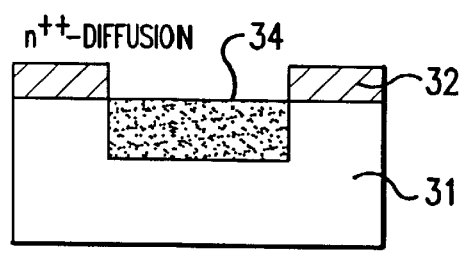
Figure 3C:
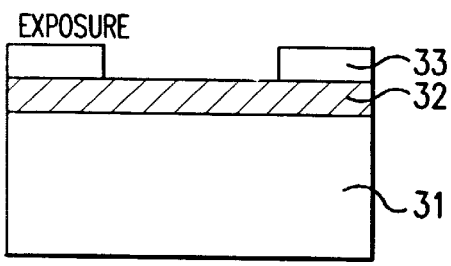
Figure 3G:
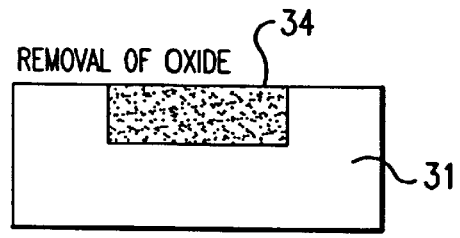
Figure 3D:
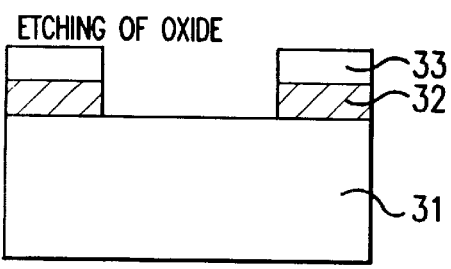
Figure 3H:
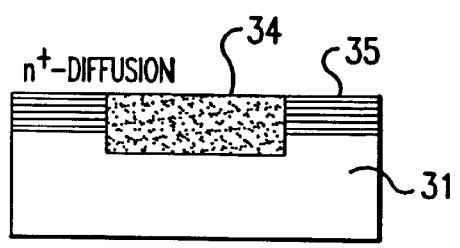

FIG. 2 is a diagram showing the penetration depth of individual dopant atoms in the region of the semiconductor substrate without masking (see line with boxes) in relation to the penetration depth of the dopant atoms in the semiconductor region covered by the mask (see line with dots). Comparison of both graphs clearly shows that in the line with boxes, the increase in concentration in the individual depth regions in the semiconductor substrate of the dopant atoms is greater than in the line with dots. This means that the diffusion at sites not covered by the mask runs more effectively and faster than at sites where the masks covers the semiconductor substrate. Therefore, doping regions can be produced in semiconductor substrates in a single process step which generates, following termination of the illuminator time, adjacent doping regions each with different dopant concentrations. Essential parameters influencing the diffusion processes are the radiation and temperature conditions at the individual semiconductor substrate surfaces, which can be suitably set by a characteristic design of the mask.

The aforedescribed process also permits production so-called back surface field solar cells, whose rear cell side is characterized by $p/p^+$-homojunctions.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A doping process for producing a homojunction in a semiconductor substrate into which dopants penetrate by way of diffusion, said process comprising:
   positioning said semiconductor substrate adjacent a light source having an emission spectrum that includes ultraviolet components;
   placing a light absorbing mask between a surface of said semiconductor substrate and said light source, said mask having a plurality of regions having respective differing thicknesses corresponding to a pattern of dopant concentration forming said homojunction in said substrate;
   applying a dopant layer of material containing dopant atoms to said surface of said semiconductor substrate, said dopant layer being disposed between said mask and said surface; and
   irradiating a surface of said mask with light from said light source, whereby said layer of material containing dopant atoms is impinged upon by a pattern of light from said light source, corresponding to said differing thicknesses of said regions of said light absorbing mask.

2. The doping process according to claim 1, wherein said dopant atoms are contained in a filmlike coat on said semiconductor substrate, said filmlike coat being applied by a process selected from the group consisting of spin-on processes, spraying on and screen printing.

3. The doping process according to claim 1, wherein said mask is composed of the same material as said semiconductor substrate.

4. The doping process according to claim 1, wherein selected regions of said mask have a thickness of zero, forming holes through which illumination radiation can reach the surface of the substrate without absorption by said mask.

5. The doping process according to claim 1, wherein said mask is composed of semiconductor strips which are applied onto the surface of the semiconductor substrate.

6. The doping process according to claim 1, wherein, for producing a two step emitter solar cell, the mask has holes in regions adjacent portions of said surface of said substrate at which higher concentrations of dopant are desired.

7. The doping process according to claim 1, wherein an irradiation time of said irradiating step is approximately 10 seconds, at a temperature of approximately 900° C.

8. The doping process according to claim 1, wherein the mask is a perforated silicon layer.

9. The doping process according to claim 1, wherein said mask provides a variation of the intensity of illumination and of the radiation spectrum upon contact with said semiconductor substrate and influences the temperature profile of said semiconductor substrate surface.

10. A semiconductor substrate having a homojunction with regions into which dopants are penetrated, said semiconductor substrate being made by a process comprising:
    positioning said semiconductor substrate adjacent a light source having an emission spectrum that includes ultraviolet components;
    placing a light absorbing mask between a surface of said semiconductor substrate and said light source, said mask having a plurality of regions having respective differing thicknesses corresponding to a pattern of dopant concentration forming said homojunction in said substrate;
    applying a dopant layer of a material containing dopant atoms to said surface of said semiconductor substrate, said dopant layer being disposed between said mask and said surface; and
    irradiating a surface of said mask with light from said light source, whereby said layer of material containing dopant atoms is impinged upon by a pattern of light from said light source, corresponding to said differing thicknesses of said regions of said light absorbing mask.

11. The substrate of claim 10, wherein said dopant atoms are contained in a filmlike coat on said semiconductor substrate, said filmlike coat being applied by a process selected from the group consisting of spin-on processes, spraying on and screen printing.

12. The substrate of claim 10, wherein said mask is composed of the same material as said semiconductor substrate.

13. The substrate of claim 10, wherein selected regions of said mask have a thickness of zero, forming holes through which illumination radiation can reach the surface of the substrate without absorption by said mask.

14. The substrate of claim 10, wherein said mask is composed of semiconductor strips which are applied onto the surface of the semiconductor substrate.

15. The substrate of claim 10, wherein for producing a two-step emitter solar cell, the mask has holes in regions adjacent portions of said semiconductor substrate at which higher concentrations of dopant desired.

16. The substrate of claim 10, wherein an irradiation time is approximately 10 seconds at a temperature of approximately 900° C.

17. The substrate of claim 10, wherein the mask is a perforated silicon layer.

18. The substrate of claim 10, wherein said mask provides a variation of the intensity of illumination and of the radiation spectrum upon contact with said semiconductor substrate and influences the temperature profile of said semiconductor substrate surface.

19. A process for doping a semiconductor substrate with regions of differing dopant concentration according to a pattern wherein different regions of said semiconductor substrate are doped with different concentrations defining a homojunction in said substrate, said process comprising:

position said substrate adjacent a light source having an emission spectrum that includes ultraviolet components;

applying a dopant layer of material containing dopant atoms to a surface of said substrate, said dopant layer being disposed between said mask and said surface; and irradiating said layer of material containing dopant atoms with light from said light source distributed according to a pattern which corresponds to said pattern of dopant concentration, whereby said dopant atoms diffuse into said substrate at differing rates according to said pattern.

20. A process according to claim 19, wherein said step of irradiating includes positioning a light absorbing mask between said light source and said surface of said substrate with said dopant atoms in said adjacent area, said mask having a plurality of regions having respective differing thicknesses arranged in said pattern which corresponds to said desired pattern of dopant concentration.

21. The process according to claim 20, wherein a thickness of selected regions of said mask is zero, said selected regions forming holes in said mask.

22. A process for doping a semiconductor substrate with regions of differing dopant concentration according to a dopant concentration, pattern, wherein different regions of said semiconductor substrate are doped with different concentrations, defining a homojunction in said substrate, said process comprising:

applying a layer of material containing dopant atoms to a surface of said substrate;

causing said dopant atoms to diffuse into said substrate at differing rates in different regions of said substrate by irradiating said layer of material containing dopant atoms with light containing an ultraviolet component, said light being distributed on said layer of material containing dopant atoms applied to said surface of said substrate, in an illumination pattern which corresponds to said dopant concentration pattern.

23. A doping process for producing a homojunction in a semiconductor substrate into which dopants penetrate by way of diffusion, said process comprising:

providing a semiconductor substrate;

applying a layer of a material containing dopant atoms to a surface of said substrate;

applying a layer of masking material onto a surface of said layer of material containing dopant atoms, whereby said layer of material containing dopant atoms is disposed between said layer of masking material and said substrate;

treating said layer of masking material to form regions having respective different thicknesses corresponding to a pattern of dopant concentration forming said homojunction in said substrate;

forming said homojunction in said substrate, by irradiating a surface of said layer of masking material with light from a light source, whereby said layer of material containing dopant atoms is impinged on by a pattern of light from said light source, corresponding to said differing thicknesses of said regions of said layer of masking material.

* * * * *